United States Patent [19]
Kawakami et al.

[11] Patent Number: 4,913,938
[45] Date of Patent: Apr. 3, 1990

[54] METHOD FOR PRODUCING COPPER FILM-FORMED ARTICLES

[75] Inventors: Takamasa Kawakami; Kazuhiro Ando; Ryuji Fujira, all of Niigata, Japan

[73] Assignee: Mitsubishi Gas Chemical Company, Inc., Tokyo, Japan

[21] Appl. No.: 288,928

[22] Filed: Dec. 23, 1988

[51] Int. Cl.4 .............................................. B05D 3/02
[52] U.S. Cl. ............................ 427/383.1; 427/383.3; 427/383.5
[58] Field of Search ................. 427/383.1, 383.3, 383.5

[56] References Cited

U.S. PATENT DOCUMENTS 4,327,131 4/1982 Branovich .
4,576,689 3/1986 Makkaev .......................... 427/383.1

Primary Examiner—Stanley Silverman
Attorney, Agent, or Firm—Sughrue, Mion, Zinn, Macpeak & Seas

[57] ABSTRACT

A method for producing a copper film-formed molding is disclosed, comprising a coating a mixed solution containing at least one copper compound selected from copper hydroxide and organic acid copper salts and a polyhydric alcohol as essential components on the desired area of an article having a heat deflection temperature of at least 165° C., and heating to a temperature of from 165° C. to the heat deflection temperature of the article and maintaining at this temperature in a non-oxidizing atmosphere.

3 Claims, No Drawings

METHOD FOR PRODUCING COPPER FILM-FORMED ARTICLES

FIELD OF THE INVENTION

The present invention relates to a method for producing copper film-formed articles. More particularly, it is concerned with a novel method for forming a copper film on articles having a heat deflection temperature (without load; hereinafter the same) of at least 165° C., e.g., plates, moldings, fibers, cloths, papers and powders of thermoplastic resins; thermosetting resins; super heat resistant resins such as polyimide, aromatic polyamide, polyamidoimide, PPS (polyphenylene sulfide), and polybenzimidazole; ceramics such as alumina, silica (quartz glass), zirconia, magnesia, iron oxide, boron nitride, alumina nitride, silicon nitride, silicon carbide, glass, and strontium titanate; carbon; and the like, which are usually electrically insulating. In the copper film-formed articles produced by the method of the present invention, copper is formly deposited without any special pretreatment and corrosive elements, e.g., halogen, are not contained at all. Thus, the copper film-formed articles are suitably used, as such or as an underground for plating of metals such as copper, in various applications, e.g., electrical and adhesive applications.

BACKGROUND OF THE INVENTION

For formation of a copper film on electrically insulating articles, the nonelectrolytic plating method, the vapor deposition method, the press adhesion method, the method using an adhesive, and so forth are used.

The nonelectrolytic plating method is most commonly used and is excellent, but has disadvantages in that a special pretreatment depending on the article is usually needed, a material modified for plating is needed depending on the type thereof, and the process is complicated. For example, when an article of thermosetting resin or thermoplastic resin is used, a method in which in order to omit or simplify the pretreatment, an article of a composition with a diene-based rubber and the like previously compounded thereto is used, is known. In this method, the performance of the resin itself is often deteriorated. In the case of an article in which a filler, e.g., glass fiber, is compounded, if the filler is exposed to the surface, good adhesion cannot be obtained.

The vapor deposition method needs a special equipment for vapor deposition, and thus a large-sized article is difficult to produce. Furthermore, the method needs a pretreatment for increasing adhesive properties depending on the type of the article.

The press adhesion method and the method using an adhesive are sometimes used, but have disadvantages in that press adhesion is impossible, the form of molding is limited, and when an adhesive is used, the adhesive layer is increased and the physical properties of the adhesive layer deteriorate the physical properties of the article.

SUMMARY OF THE INVENTION

As a result of investigations to develop a method which provides copper film-formed material which is economical and of high quality, by a simplified method, the present invention has been completed.

The present invention relates to a method for forming a copper film-formed article which comprises coating a mixed solution containing a copper compound selected from the group consisting of copper hydroxide and organic acid copper salt and a polyhydric alcohol as essential components on the predetermined area of an article having a heat deflection temperature of at least 165° C., and then maintaining the article while heating at a temperature of from 165° C. to the heat deflection temperature of the article in a nonoxidizing atmosphere.

DETAILED DESCRIPTION OF THE INVENTION

The article having a heat deflection temperature of at least 165° C. to be used in the present invention is a usual electrically insulating article, e.g., a plate, a molding, a fiber, a cloth, a paper and a powder, of a thermoplastic resin; a thermosetting resin; a super heat resistant resin such as polyimide, aromatic polyamide, polyamidoimide, PPS (polyphenylene sulfide), and polybenzimidazole; a ceramics such as alumina, silica (quartz glass), zirconia, magnesia, iron oxide, boron nitride, aluminum nitride, silicon nitride, silicon carbide, glass, and strontium titanate; carbon; and so forth.

Specific examples of the thermoplastic resin include general purpose engineering plastics, e.g., polyamide resins such as Nylon-6, Nylon-66, Nylon-6/66, Nylon-11, Nylon-3, and MXD 6, MXD 6/10, etc., as derived from mata-xylylenediamine and aliphatic dicarboxylic acids, and crystalline polyester resins such as polybutylene terephthalate and polyethylene terephthalate, aromatic polyesters containing p-hydroxybenzoic acid, phthalic acid, bisphenol and the like as main monomers, aromatic polyester crystalline polymers obtained by grafting polyethylene terephthalate to the above aromatic polyester, polyetherimide, polysulfone, polysalfone, polyethersulfone, polyetherether ketone, and polyphenyleneether, and fibers of the above polymers, minerals, and other filler reinforcing materials. Of these, those having a heat deflection temperature of at least 190° C. are preferred. In particular, polymers having a heat deflection temperature of at least 210° C. are preferred in that the conditions for the formation of the copper film can be chosen from a wider range.

Specific examples of the thermosetting resin include the usual thermosetting resins such as a phenol resin, a diallylphthalate resin, an epoxy resin, a polyamine-bismaleimide resin, a polymaleimide-epoxy resin, a polymaleimide-isocyanate resin, a cyanate resin, a cyanate-epoxy resin, a cyanate-polymaleimide resin, and a cyanate-epoxy-polymaleimide resin; thermosetting so-called "IPN" as obtained by compounding the above thermosetting resins and engineering plastics such as polyamide (Nylon), aromatic polyester, polyetherimide, polyetherether ketone, polysulfone, and polyphenyleneether, and further adding a catalyst; crosslinkable resins obtained by compounding an organic peroxide as a crosslinking agent and a radical polymerizable polyfunctional compound, a thermosetting resin and the like to resins, e.g., polyolefin such as polyethylene and 1,2-polybutadiene; and reinforced materials obtained by compounding glass, carbon, alumina, other fibers, fiber cloth, powder and other fillers to the above polymers of these, those having a glass transition temperature of at least 160° C. are preferred. In particular, polymers having a glass transition temperature of at least 180° C. are preferred in that the conditions for the formation of the copper film can be chosen from a wider range.

Specific examples of the super heat resistant resin include polyimide, aromatic polyamide, polyamidoimide, PPS (polyphenylene sulfide), and polybenzimidazole.

Specific examples of the ceramics include alumina, silica (quartz glass), silica-alumina, zirconia, magnesia, iron oxide, boron nitride, aluminum nitride, silicon nitride, silicon carbide, glass (e.g., alkali-free glass, alkali glass and lead glass), carbon (e.g., glassic carbon and graphite), and strontium titanate.

In forming the copper film on the article, a mixed solution containing a copper compound selected from copper hydroxide and organic acid copper salts and a polyhydric alcohol as essential components (hereinafter referred to as a "processing solution") is used.

The copper compound is copper hydroxide or an organic acid copper salt. Compounds which do not carbonize at the temperature at which the copper film is formed and is easily separated from the surface are preferably used. Taking into consideration the cost and availability, the suitable one is chosen. More specifically, the copper salts of monocarboxylic acid such as formic acid, acetic acid, propionic acid, butyric acid, pivalic acid, capronic acid, capric acid, lauric acid, stearic acid, naphthenic acid, benzoic acid, oleic acid, acrylic acid, methacrylic acid, crotonic acid and pentenic acid; the copper salts of polycarboxylic acid such as oxalic acid, malonic acid, succinic acid, glutaric acid, adipic acid, pimeric acid, succinic acid, azelaic acid, brassylic acid, maleic acid, fumaric acid, phthalic acid, trimellitic acid, and maleic acid; and the copper salts of mono- or polycarboxylic acid esters, amide or the like, the hydroxyl group of glucolic acid and the like, and the copper salts of amino acid such as glutaric acid can be used. Of these copper compounds, copper hydroxide, copper formate and copper acetate are preferably used.

The polyhydric alcohol is a compound containing two or more hydroxyl groups. There are no special limitations to the polyhydric alcohol to be used in the present invention. However, compounds which exhibit good wetting properties to the surface of the article to be used and which can be easily separated from the surface at the temperature at which the copper film is formed are preferably used. Specific examples of the polyhydric alcohol are ethylene glycol, propylene glycol, butane diol, pentane diol, hexane diol, 1,5-hexadiene-3,4-diol, 2,6-octadiene-4,5-diol, glycerine, 1,2,3-butanetriol, 1,2,3-pentanetriol, pentamethyl glycerine, erythrite, pentaerythrite, adonite, arabite, diethylene glycol, triethylene glycol, dipropylene glycol, and other polyalkylene glycols, and further diethanolamine, triethanolamine and the like. Of these, glycerine is preferred.

The processing solution of the present invention is prepared by mixing copper hydroxide or an organic acid copper salt and polyhydric alcohol. The ratio of the copper hydroxide or organic acid copper salt to the polyhydric alcohol in the processing solution is not critical so long as a uniform mixture is obtained. It is preferred, however, that the copper hydroxide or organic acid copper salt be used in a greater amount. The copper hydroxide or organic acid copper salt is used in an amount of usually 10 to 70% by weight and preferably 20 to 60% by weight. The mixture is made uniform by mixing at ordinary temperature or while heating.

In preparing the processing solution of the present invention, additives other than the aforementioned can be used in combination. Examples of such additives include organic acids, amines, organic solvents, surfactants, copper and other metal salts, and polyvinyl alcohol The above processing solution is coated on the desired area of the article by coating techniques such as printing, brush coating, dipping, spray coating, bar coating, and roll coating, and then heated in a nonoxidizing atmosphere to form the copper film-formed article of the present invention.

The nonoxidizing atmosphere can be produced by using gases such as $N_2$, Ar, $CO_2$, CO and $H_2$, or by covering the coated surface with a film such as Teflon and then heating, thereby maintaining in an atmosphere of decomposition gas from the coated layer. Heating is carried out, batchwise or continuously, by the use of radiation heating such as infrared rays, electron rays, microwaves and the like, or an electric furnace, an oven, oil heating, pressed steam and so forth. Heating is carried out usually at a temperature-raising rate of 50° to 2,000° C./hr and preferably at a temperature-raising rate of 100° to 1,000° C./hr. Heating is carried out within the temperature range of from 165° C. to not more than the heat deflection temperature of the article, preferably within the temperature range of 170° to 300° C. and within the temperature range not more than the heat deflection temperature of the article, or maintaining for not more than 3 hours, preferably several minutes to about 2 hours within the above temperature range.

In accordance with the method of the present invention using a mixed solution obtained by uniformly mixing copper hydroxide or an organic acid copper salt and a polyhydric alcohol, a copper film having excellent adhesion properties can be easily formed by a simplified technique on an article which is difficult to form a copper film on the surface thereof unless a special pretreatment is applied thereto. The copper film can be used as an underlying treatment, e.g., electroplating, electroless plating, vacuum deposition, substitute of copper foil adhesion, and welding underlying layer, in a copper formed film, a copper formed plate and other applications, or can be used as an electrically conductive and thermally conductive film, as such or after formation of an antioxidant coating.

The present invention is described in greater detail with reference to the following examples. All parts are by weight unless otherwise indicated.

REFERENCE EXAMPLE 1

(Preparation of Processing Solution)

The following copper compounds and polyhydric alcohols were thoroughly mixed to prepare uniform, viscous processing solutions.

Processing Solution 1: Copper hydroxide/glycerine = 100/200

Processing Solution 2: Copper formate/ethylene glycol = 100/100

Processing Solution 3: Copper hydroxide/triethanolamine = 100/200

Processing Solution 4: Copper formate/glycerine = 100/200

Processing Solution 5: Copper acetate/glycerine = 100/200

Processing Solution 6: Copper formate/triethanolamine = 100/200

Processing Solution 7: Copper hydroxide/glycerine/formic acid = 100/200/10

EXAMPLE 1

The processing solution 1 obtained in Reference Example was coated in a thickness of 60 μm on one side of a 3 mm thick molding made of Nylon MXD6 prepared from meta-xylylenediamine and adipic acid as reinforced with glass fibers, and the molding thus coated was heated to 180° C. over 30 minutes in an atmosphere of nitrogen gas from a cylinder, maintained at this temperature for 60 minutes, and then taken out of the atmosphere. On the surface of the molding of Nylon MXD6, a copper film was uniformly formed. The copper film had a thickness of 3 μm and a volume resistance of $3 \times 10^{-4}$ Ω.cm. The peeling test results according to the cellotape cross-cut testing method were 100/100.

EXAMPLE 2

A molding of Nylon MXD6 on which a lustrous copper film was uniformly formed was produced in the same manner as in Example 1 except that the processing solution 2 obtained in Reference Example was used.

EXAMPLE 3

A molding of Nylon MXD6 on which a copper film was uniformly formed was produced in the same manner as in Example 1 except that the processing solution 3 obtained in Reference Example was used.

EXAMPLES 4 TO 11

In Examples 1 to 3, by using moldings of polyacrylate (trade name: U Polymer, produced by Unitika Ltd.; hereinafter referred to as "U Polymer"), polysulfone (trade name: Udel Polysulfone, produced by Amoco Chemicals Corp.; hereinafter referred to as "UPSF"), 20 wt % glass fiber reinforced polyethersulfone (produced by Mitsui Toatsu Chemicals Inc.; hereinafter referred to as "PESF"), polyetherimide (trade name: Ultem, produced by General Electric Corp.; hereinafter referred to as "Ultem"), and polyetheretherketone (trade name: Victrex, produced by ICI (GB) Corp.; hereinafter referred to as "PEEK") in place of the molding of Nylon MXD6 and processing under the conditions shown in Table 1, moldings with a uniform copper film formed thereon were obtained. The results are shown in Table 1.

TABLE 1

| | Molding | Processing Solution | Processing Temperature (°C.) | Processing Time (min) | Appearance of Copper Film |
|---|---|---|---|---|---|
| Example 4 | U Polymer | 1 | 180 | 60 | Uniform bonding |
| Example 5 | UPSF | 1 | 180 | 60 | Uniform bonding |
| Example 6 | PESF | 1 | 180 | 60 | Uniform bonding |
| Example 7 | PESF | 4 | 180 | 60 | Uniform bonding |
| Example 8 | Ultem | 1 | 180 | 60 | Uniform bonding |
| Example 9 | Ultem | 4 | 180 | 60 | Uniform bonding |
| Example 10 | Ultem | 5 | 180 | 60 | Uniform bonding |
| Example 11 | PEEK | 4 | 180 | 60 | Uniform bonding |

EXAMPLE 12

(Thermosetting-1)

The processing solution 4 was coated in a thickness of 120 μm on one side of a glass fiber reinforced cyanate-maleimide-epoxy-based resin laminate (trade name: BT-GHL 800, produced by Mitsubishi Gas Chemical Company, Inc.), and the laminate thus coated was heated to 180° C. over 30 minutes in an atmosphere of nitrogen gas from a cylinder, maintained at this temperature for 60 minutes, and then taken out of the atmosphere. On the surface of the laminate, a copper film was uniformly formed.

The copper film had a thickness of 3 μm and a volume resistance of $1.0 \times 10^{-4}$ Ω.cm. The peeling results according to the cellotape cross-cut testing method were 100/100. Even after boiling for 2 hours, swelling and peeling did not occur.

EXAMPLE 13

A laminate on which a lustrous copper film was uniformly formed was produced in the same manner as in Example 12 except that the processing solution 1 was used.

The copper film had a thickness of 6 μm and a volume resistance of $7.0 \times 10^{-5}$ Ω.cm. The peeling test results according to the cellotape cross-cut testing method were 100/100. Even after boiling for 2 hours, swelling and peeling did not occur.

A laminate on which a lustrous copper film was uniformly formed was produced in the same manner as above except that the thickness of the processing solution 1 coated was 20 μm.

The copper film had a thickness of 0.5 μm and a volume resistance of $1.0 \times 10^{-4}$ Ω.cm. The peeling test results according to the cellotape cross-cut testing method were 100/100. Even after boiling for 2 hours, swelling and peeling did not occur.

EXAMPLE 14

A laminate on which a lustrous copper film was uniformly formed was produced in the same manner as in Example 12 except that the processing solution 5 was used.

EXAMPLE 15

A laminate on which a copper film was uniformly formed was produced in the same manner as in Example 12 except that the processing solution 6 was used.

EXAMPLES 16 TO 20

In Example 12, by using a glass fiber reinforced epoxy resin laminate (trade name: Glass Epoxy GEP 170, produced by Mitsubishi Gas Chemical Company, Inc.; hereinafter referred to as "GEP1") and a glass fiber reinforced epoxy resin laminate (hereinafter referred to as "GEP2") using a four functional epoxy resin (trade name Tetrad X, produced by Mitsubishi Gas Chemical Company, Inc.) prepared from xylylenediamine and epichlorohydrin in place of the glass fiber reinforced cyanate-maleimide-epoxybased resin laminate, and processing under the conditions shown in Table 2, moldings on which a copper film was uniformly formed were obtained. The results are shown in Table 2.

TABLE 2

| | Molding | Processing Solution | Processing Temperature (°C.) | Processing Time (min) | Appearance of Copper Film |
|---|---|---|---|---|---|
| Example 16 | GEP 1 | 4 | 180 | 60 | Uniform bonding |
| Example 17 | GEP 1 | 1 | 180 | 60 | Uniform bonding |
| Example 18 | GEP 2 | 4 | 180 | 60 | Uniform bonding |
| Example 19 | GEP 2 | 1 | 180 | 60 | Uniform bonding |
| Example 20 | GEP 2 | 3 | 180 | 60 | Uniform bonding |

EXAMPLE 21

(Super Heat Resistant Resin-1)

The processing solution 4 was coated on one surface of a polyimide film (trade name: Capton, produced by Toray Du Pont Co., Ltd.; thickness: 30 μm) both surfaces of which were lustrous, in a thickness of 20 μm, and the film was heated to 200° C. over 30 minutes in an atmosphere of nitrogen gas from a cylinder, maintained at this temperature for 60 minutes, and then taken out of the atmosphere.

On the polyimide film, a lustrous copper film was uniformly formed.

The copper film had a thickness of 0.3 μm and a volume resistance of $1.0 \times 10^{-4}$ Ω.cm. The peeling test results according to the cellotape cross-cut testing method were 100/100. Even after 2 hour boiling, swelling and peeling did not occur at all.

A uniformly formed lustrous copper film was obtained in the same manner as above except that the thickness of the processing solution coated was 120 μm.

The copper film had a thickness of 3 μm and a volume resistance of $7.0 \times 10^{-5}$ Ω.cm. The peeling test results according to the cellotape cross-cut testing method were 100/100. Even after 2 hour boiling, swelling and peeling did not occur at all.

EXAMPLE 22

A polyimide film on which a lustrous copper film was uniformly formed was produced in the same manner as in Example 21 except that the processing solution 1 was used and coated in a thickness of 120 μm.

The copper film had a thickness of 6 μm and a volume resistance of $5.0 \times 10^{-5}$ Ω.cm. The peeling test results according to the cellotape cross-cut testing method were 100/100. Even after 2 hour boiling, swelling and peeling did not occur at all.

EXAMPLE 23

A polyimide film on which a lustrous copper film was uniformly formed was produced in the same manner as in Example 21 except that the processing solution 5 was used.

EXAMPLE 24

A polyimide film on which a lustrous copper film was uniformly formed was produced in the same manner as in Example 21 except that the processing solution 6 was used.

EXAMPLE 25

A polyimide film on which a lustrous copper film was uniformly formed was produced in the same manner as in Example 21 except that the processing solution 2 was used.

EXAMPLE 26

A molding on which a copper film was formed was produced in the same manner as in Example 21 except that a 3 mm thick PPS molding was used in place of the polyimide film and the processing solution 4 was coated in a thickness of 120 μm.

The copper film had a thickness of 3 μm and the peeling test results according to the cross-cut testing method were 100/100. Even after 2 hour boiling, swelling and peeling did not occur at all.

EXAMPLE 27

A molding on which a copper film was formed was produced in the same manner as in Example 26 except that the processing solution 7 was used.

EXAMPLE 28

A molding on which a copper film was uniformly formed was produced in the same manner as in Example 26 except that the processing solution 5 was used.

EXAMPLE 29

The processing solution 4 was coated on one surface of an alumina plate (produced by Nippon Kagaku Tougyou Co., Ltd.; thickness: 0.6 mm) in a thickness of 120 μm, and the plate was heated to 200° C. over 30 minutes in an atmosphere of nitrogen gas from a cylinder, maintained at this temperature for 60 minutes, and then taken out of the atmosphere.

A copper film was uniformly formed on the surface of the alumina plate.

The copper film had a thickness of 3 μm and a volume resistance of $7.0 \times 10^{-5}$ Ω.cm. The peeling test results according to the cellotape cross-cut testing method were 100/100. Even after 2 hour boiling, swelling and peeling did not occur at all.

EXAMPLE 30

An alumina plate on which a copper film was uniformly formed was produced in the same manner as in Example 1 except that the processing solution 1 was used.

The copper film had a thickness of 6 μm and a volume resistance of $4.0 \times 10^{-5}$ Ω.cm. The peeling test results according to the cellotape cross-cut testing method were 100/110. Even after 2 hour boiling, swelling and peeling did not occur at all.

EXAMPLE 31

An alumina plate on which a copper film was uniformly formed was produced in the same manner as in Example 29 except that the processing solution 5 was used.

EXAMPLE 32

An alumina plate on which a copper film was uniformly formed was produced in the same manner as in Example 29 except that the processing solution 6 was used.

EXAMPLE 33

An aluminum plate on which a copper film was uniformly formed was produced in the same manner as in Example 29 except that the processing conditions were such that the temperature was raised to 500° C. over 60 minutes and then immediately lowered.

The copper film had a thickness of 2 μm and a volume resistance of $3.0 \times 10^{-5}$ Ω.cm. The peeling test results according to the cellotape cross-cut testing method were 100/100. Even after 2 hour boiling, swelling and peeling did not occur at all.

EXAMPLES 34 TO 42

Ceramic plates on which a copper film was uniformly formed were produced in the same manner as in Example 29 except that the ceramic plates shown in Table 3 were used in place of the alumina plate and the processing was carried out under the conditions shown in Table 3. The results are shown in Table 3.

TABLE 3

| Sample | | Processing Solution | Processing Temperature (°C.) | Processing Time (min) | Appearance of Copper Film |
| --- | --- | --- | --- | --- | --- |
| Example 34 | $ZrO_2$ | 4 | 200 | 60 | Uniform bonding |
| Example 35 | $Si_3N_4$ | 4 | | 60 | Uniform bonding |
| Example 36 | $BaTiO_3$ | 1 | 200 | 60 | Uniform bonding |
| Example 37 | $SrTiO_3$ | 1 | 200 | 60 | Uniform bonding |
| Example 38 | SiC | 1 | 200 | 60 | Uniform bonding |
| Example 39 | Glassic carbon | 4 | 200 | 60 | Uniform bonding |
| Example 40 | Quartz glass | 4 | 200 | 60 | Uniform bonding |
| Example 41 | Quartz glass | 1 | 200 | 60 | Uniform bonding |
| Example 42 | Slide glass | 4 | 200 | 60 | Uniform bonding |

While the invention has been described in detail and with reference to specific embodiments thereof, it will be apparent to one skilled in the art that various changes and modifications can be made therein without departing from the spirit and scope thereof.

We claim:

1. A method for producing a copper film-formed molding which comprises coating a mixed solution consisting essentially of a copper compound selected from the group consisting of copper hydroxide and organic acid copper salts and a polyhydric alcohol on the desired area of an article having a heat deflection temperature of at least 165° C., and then heating and maintaining the article at a temperature of from 165° C. to the heat deflection temperature of the article in a nonoxidizing atmosphere, wherein the mixed solution consists essentially of 10 to 70% by weight of the copper compound and 90 to 30% by weight of the polyhydric alcohol.

2. The method as claimed in claim 1, wherein the copper compound is at least one copper compound selected from the group consisting of copper hydroxide, copper formate and copper acetate.

3. The method as claimed in claim 1, wherein the polyhydric alcohol is glycerine.

* * * * *